United States Patent [19]

Matsumoto

[11] Patent Number: 5,705,028
[45] Date of Patent: Jan. 6, 1998

[54] METHOD OF MANUFACTURING A SEMICONDUCTOR DEVICE WITH FLATTENED MULTI-LAYER WIRINGS

[75] Inventor: Yasuhiko Matsumoto, Hamamatsu, Japan

[73] Assignee: Yamaha Corporation, Hamamatsu, Japan

[21] Appl. No.: 605,709

[22] Filed: Feb. 22, 1996

Related U.S. Application Data

[63] Continuation of Ser. No. 230,349, Apr. 20, 1994, abandoned.

[30] Foreign Application Priority Data

Apr. 21, 1993 [JP] Japan ................... 5-117859

[51] Int. Cl.⁶ ........................... H01L 21/304
[52] U.S. Cl. .............. 156/636.1; 437/195; 437/228; 437/231
[58] Field of Search ................ 437/186, 195, 437/187, 231, 228; 156/636.1; 216/38, 88

[56] References Cited

U.S. PATENT DOCUMENTS

| | | | |
|---|---|---|---|
| 4,944,836 | 7/1990 | Beyer et al. | 156/645 |
| 5,110,763 | 5/1992 | Matsumoto | 437/195 |
| 5,246,884 | 9/1993 | Jaso et al. | 437/225 |
| 5,252,515 | 10/1993 | Tsai et al. | 437/195 |
| 5,262,354 | 11/1993 | Cote et al. | 437/195 |
| 5,272,117 | 12/1993 | Roth et al. | 437/228 |
| 5,302,233 | 4/1994 | Kim et al. | 156/636 |
| 5,302,551 | 4/1994 | Iranmesh et al. | 437/228 |
| 5,310,626 | 5/1994 | Fernandes et al. | 430/327 |
| 5,312,512 | 5/1994 | Allman et al. | 156/636 |
| 5,314,843 | 5/1994 | Yu et al. | 437/225 |
| 5,328,553 | 7/1994 | Poon | 156/636 |
| 5,331,117 | 7/1994 | Bryant et al. | 174/250 |
| 5,332,694 | 7/1994 | Suzuki | 437/189 |
| 5,334,552 | 8/1994 | Homma | 437/195 |
| 5,356,513 | 10/1994 | Burke et al. | 156/636 |

FOREIGN PATENT DOCUMENTS

| | | |
|---|---|---|
| 023146 | 1/1981 | European Pat. Off. |
| 50-99684 | 8/1975 | Japan . |
| 59-13693 | 8/1984 | Japan . |
| 2177433 | 7/1990 | Japan . |

OTHER PUBLICATIONS

"Proposal of Introducing Fine Machining Technology into Planarization and Fundamentals of Fine Machining Technology", Break Through Seminar No. 4, pp. 34–46 and 97–102, 2/23–24/93.

Wolf, Stanley, Ph.D., "Silicon Processing for the VLSI Era", vol. 2, Process Integration, Lattice Press, pp. 222–229., 1990.

S. Wolf, "Silicon Processing for the VLSI Era", vol. 2, Process Integration, pp. 229–230, (1990).

"Semiconductor World 1992.10" pp. 43–44, Oct. 1992. (Japanese).

*Primary Examiner*—John Niebling
*Assistant Examiner*—Thomas G. Bilodeau
*Attorney, Agent, or Firm*—Loeb & Loeb LLP

[57] ABSTRACT

A wiring layer formed on a field insulating film covering the surface of a semiconductor substrate is covered with an interlayer film. The interlayer film is covered with a flat film such as spin-on-glass formed by spin coating. The flat film has, for example, a laminated structure of an organic SOG film and an inorganic SOG film. The inorganic SOG film is suitable for obtaining a polishing speed generally equal to that of a CVD oxide film. The insulating film and the flat film are chemical-mechanical polished at a same polishing speed until the flat film is thoroughly removed, to leave a planarized insulating film.

31 Claims, 4 Drawing Sheets

METHOD OF MANUFACTURING A SEMICONDUCTOR DEVICE WITH FLATTENED MULTI-LAYER WIRINGS

This is a continuation of application Ser. No. 08/230,349 filed Apr. 20, 1994, now abandoned.

BACKGROUND OF THE INVENTION

1. Field of the Invention

The present invention relates to a method of manufacturing a semiconductor device, and more particularly to a semiconductor device manufacturing method having a step of planarizing the surface of an interlayer insulating film through chemical-mechanical polishing (hereinafter abbreviated as CMP).

2. Description of Related Art

Coating spin-on-glass (SOG) has been used widely as a method of planarizing the surface of an interlayer insulating film. However, flatness obtained by SOG is not sufficient if three or four wiring layers are used. It is difficult to precisely pattern the third or fourth wiring layer, thereby hindering miniaturization of devices.

Recently, planarization by CMP has been proposed and used for substrates of large scale integration circuits having three or more wiring layers.

FIG. 11 shows an example of a CMP apparatus used for wafers such as LSI substrates. A polishing stool 1 has a pad 2 thereon and is rotated in the direction indicated by an arrow A during a CMP process. A vacuum chuck 3 holds a wafer 4 which is moved down to the polishing stool in the direction indicated by an arrow B. The wafer 4 is rotated in the direction indicated by an arrow C during a CMP process. High purity alkali colloidal slurry is supplied between the pad 2 and wafer 4 to polish the surface of the wafer 4 during a CMP process.

FIG. 12 shows an example of a cross section of a wafer that underwent a CMP process. A field insulating film 12 is formed on the surface of a semiconductor substrate 10. Wiring layers 14a, 14b, and 14c formed on the insulating film 12 are covered with an interlayer insulating film 16. It is preferable that the surface of the insulating film 16 be flat in order to form fine wirings thereon. The surface of the insulating film 16 formed by chemical vapor deposition (CVD) or the like has a shape conformal to the underlying structure as indicated by a broken line. The insulating film 16 is planarized thereafter by a CMP process using the apparatus shown in FIG. 11.

As shown in FIG. 12, a relatively flat surface is obtained at the region where wiring patterns are dense. However, at the region where wiring patterns are sparse, flatness is degraded because the surface before a CMP process is uneven, for example, at the region between the wiring layers 14a and 14b.

To solve this problem, it has been proposed to deposit a material such as $Si_3N_4$ having a low processing speed at only those hollow regions, for example, between the wiring layers 14a and 14b (for example, Monthly Magazine, "Semiconductor World", pp. 43 to 44, October, 1992). With this method, however, the process is complicated because a deposited film such as $Si_3N_4$ is required to be selectively etched to leave only necessary regions.

SUMMARY OF THE INVENTION

It is an object of the present invention to provide a method of manufacturing a semiconductor device capable of reducing a dependency of planarization by CMP upon an underlying pattern by using simple processes.

According to one aspect of the present invention, a method of manufacturing a semiconductor device is provided. The method includes the steps of: (a) providing an underlying structure of a semiconductor substrate having an interconnection thereon; (b) forming a first insulating film, having conformal topography to the underlying structure, over the underlying structure; (c) forming a sacrificial film, having non-conformal topography to the first insulating film, over the first insulating film; and (d) chemical-mechanical polishing the first insulating film and the sacrificial film to provide a planarized first insulating film.

After a flat film such as SOG is coated on an insulating film, a CMP process is performed at a same polishing speed for both the insulating film and flat film. Accordingly, uniform polishing is performed even at the region where underlying patterns are sparse so that shallow regions can be prevented from being formed. The region where underlying patterns are dense is polished at the same speed as that for the region where patterns are sparse. Accordingly, the polished amount is made uniform for both the regions where patterns are dense and sparse.

Furthermore, since the CMP process continues until the thin film is thoroughly removed, there is no fear of lowered reliability to be caused by the thin film remaining unremoved. As the flat film, insulating material as well as conductive material can be used.

Addition of only a flat film coating process improves flatness of an interlayer insulating film processed by CMP. Therefore, fine wirings can be formed on an insulating film with high reliability and high yield.

DETAILED DESCRIPTION OF THE PREFERRED EMBODIMENTS

Figure 1:
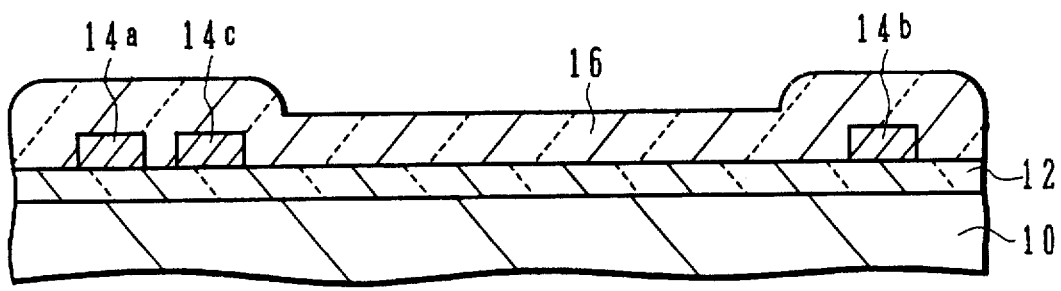
FIG. 1 is a cross sectional view of a substrate explaining an interlayer insulating film forming process of a surface planarizing method, according to an embodiment of a method of manufacturing a semiconductor device according to the present invention.
Figure 2:
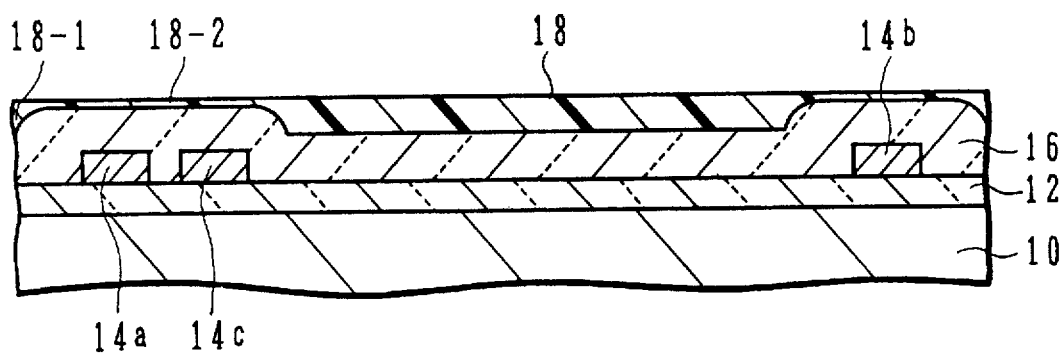
FIG. 2 is a cross sectional view of the substrate explaining a flat film coating process following the process explained with reference to FIG. 1.
Figure 3:
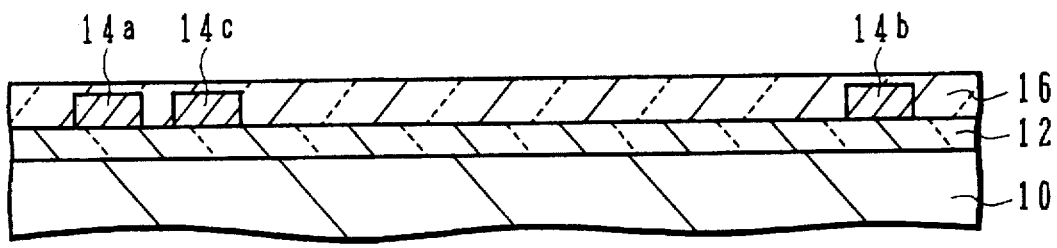
FIG. 3 is a cross sectional view of the substrate explaining a CMP process following the process explained with reference to FIG. 2.

FIGS. 1 to 3 are cross-sectional views of a substrate explaining a surface planarizing process according to an embodiment of the present invention. Processes (1) to (3) corresponding to FIGS. 1 to 3 will be described in this order.

(1) A wiring layer such as Al alloy is deposited on an insulating film 12 such as silicon oxide covering the surface of a semiconductor substrate 10 such as silicon. Thereafter, the wiring layer is patterned to have a desired shape, forming wiring layers 14a, 14b, and 14c. An interlayer insulating film 16 substantially consisting of silicon oxide is formed by CVD or the like over the substrate.

The interlayer insulating film 16 is made of, for example, a phospho-silicate glass (PSG) film, a boron phospho-silicate glass (BPSG) film, a plasma oxide film, or the like. The PSG film is formed by atmospheric pressure CVD at a substrate temperature of about 400° C. by using source gases of $SiH_4$ and $PH_3$. The BPSG film is formed by atmospheric pressure CVD at a substrate temperature of about 400° C. by using source gases of $SiH_4$, $PH_3$, and $B_2H_6$. The plasma oxide film Is also formed by plasma CVD at a substrate temperature of about 400° C. by using source gases of tetraethoxysilane (TEOS) and oxygen gas.

Although TEOS oxide film has some tendency of reflow to decrease the step, it still leaves a step. Thus, these oxide films will be called conformal oxide films in this specification.

The interlayer insulating film 16 is formed flat at the region between the wiring layers 14a and 14c where a space between the wiring layers is small, and is formed shallow at the region between the wiring layers 14b and 14c where a space between the wiring layers is large. The thickness of the interlayer insulating film 16 is set thicker than the wiring layers 14a, 14b, and 14c.

(2) Next, a sacrificial layer 18 is coated flat on the insulating film 16 by a known spin coating method. The sacrificial layer 18 is formed by coating, for example, organic SOG, inorganic SOG, or polyimide such as silicon denatured polyimide. The organic SOG is prepared by mixing $R_nSi(OH)_{4-n}$(silanol) organic glass with solvent, where R stands for —$CH_3$, —$C_6H_5$, or —$C_2H_5$. The inorganic SOG is prepared by mixing $Si(OH)_4$ with solvent.

Steps of the interlayer insulating film 16 such as a CVD oxide film are filled with the sacrificial layer 18 to form the flat sacrificial layer 18. The pad used in a CMP process elastically deforms when a load is applied thereto during polishing. Therefore, if polishing is performed without filling the steps of the interlayer insulating film 16, the polishing speed at the edges of the insulating film 16 having convex topography becomes very fast so that the edges are polished more than the other regions, resulting in beveled edge topography. This beveled topography can be avoided by filling concave regions with SOG as the sacrificial layer 18.

Inorganic SOB has a hardness nearer to a hardness of an oxide film such as BPSG than organic SOG. Therefore, a polishing speed generally the same as a CVD oxide film can be obtained during a CMP process.

(3) Next, the insulating film 16 and the sacrificial layer 18 are polished at a CMP process generally at a same polishing speed. In the polishing step, the sacrificial layer 18 begins to be removed. At an early stage, only the sacrificial layer 18 is uniformly removed through the polishing process, since the sacrificial layer 18 is non-conformal and covers over a convex portion and a concave portion of the insulating film 16. After uniformly removing the sacrificial layer 18 by a certain thickness, the convex parts of the insulating layer 16 are exposed, i.e., the insulating film 16 and the sacrificial layer 18 are coplanarized. The coplanarized structure of the sacrificial layer 18 and the insulating film 16 are simultaneously removed through the polishing process until the sacrificial layer 18 is thoroughly removed, to thus leave a planarized insulating film 16. The reasons for global planarization of the insulating film 16 are considered as follows:

(A) The concave portion of the insulating film 16 is filled with the sacrificial layer 18.

(B) The sacrificial layer 18 becomes coplanarized with the insulating film 16 in tile midst of the polishing process. As a result, the load is uniformly applied to the sacrificial layer 18 and the insulating film 16 through the polishing pad, thus, the sacrificial layer 18 and the insulating film 16 are simultaneously removed. Therefore, generation of a beveled edge of the convex portion in the insulating film 16 is avoided. Flatness of the insulating film 16 is good irrespective of a space between wiring layers.

The polishing liquid may be, for example, colloidal silica slurry or $CeO_2$ based slurry. A head pressure is, for example, 2 to 15 psi (pounds per square inch). A head revolution rate and a polishing stool revolution rate are, for example, 10 to 40 rpm. A temperature of the polishing stool is, for example, 25° to 50° C. A pad is made of, for example, polymer materials.

An upper wiring layer may be formed on the insulating film 16 by forming desired contact holes in the insulating film 16 and connecting the upper wiring layer to the underlying wiring layer 14a, 14b, 14c. In this case, since the insulating film becomes flat, the upper wiring layer can be formed easily to have a fine pattern.

A method of forming multi-layer wirings on a semiconductor substrate will be described as an illustrative embodiment. The semiconductor substrate is prepared by the above-described embodiment.

Figure 4:
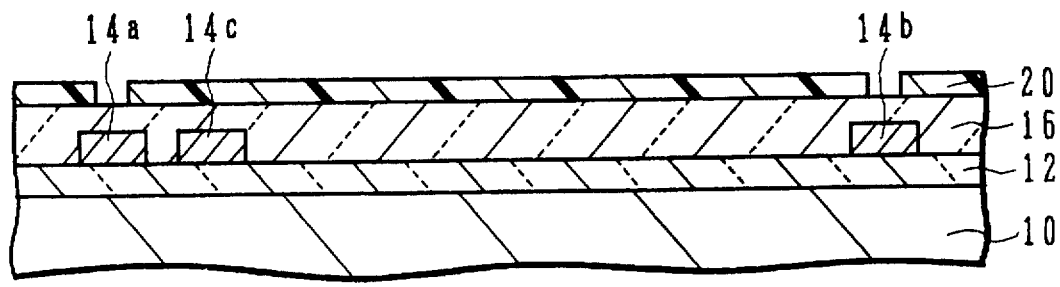
FIGS. 4 to 10 are cross-sectional views explaining processing steps of a method of manufacturing a semiconductor device according to another embodiment of the present invention.

Following the processing steps depicted in FIG. 3, as shown in FIG. 4, photoresist 20 is deposited on the flat insulating film 16 and patterned to have openings at positions corresponding to contact holes to an upper metal layer.

Figure 5:
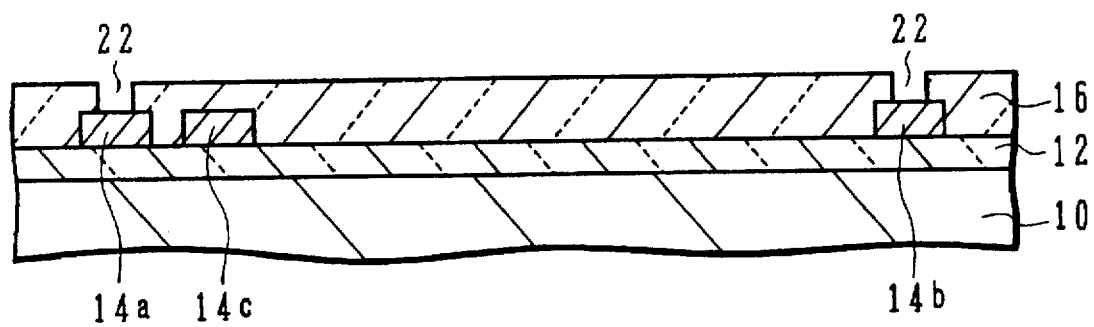
Figure 6:
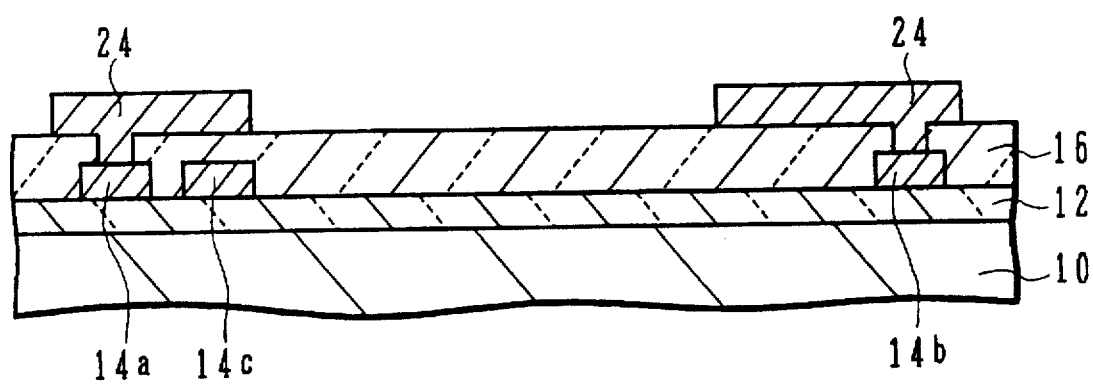
Figure 7:
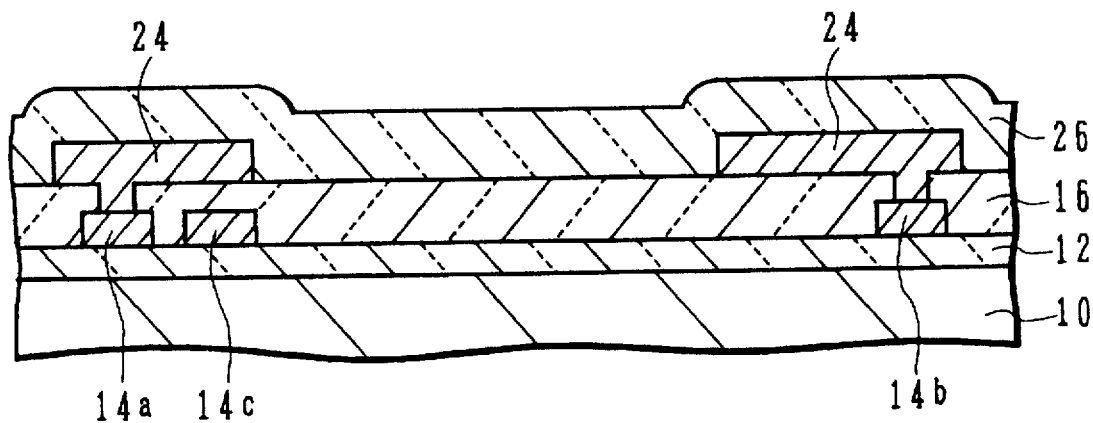
Figure 8:
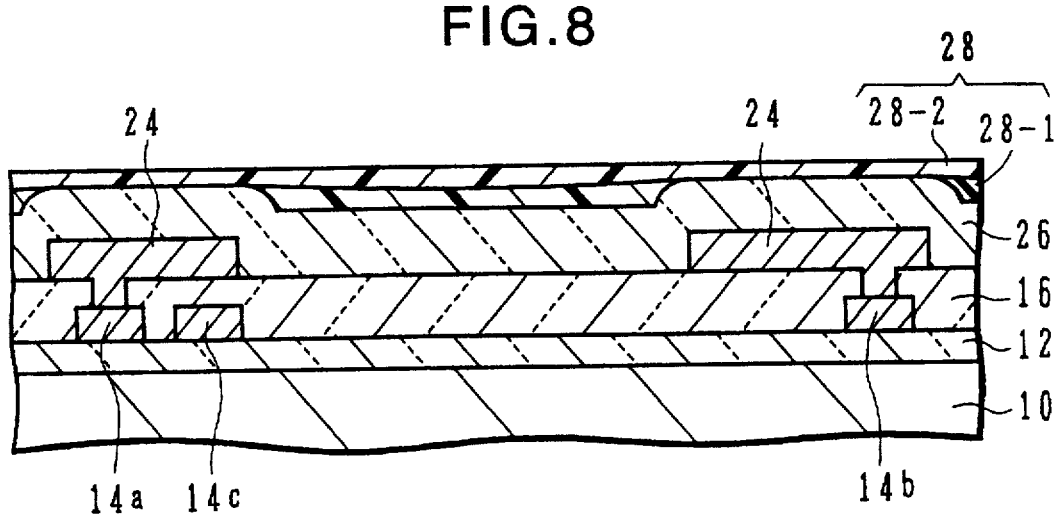
Figure 9:
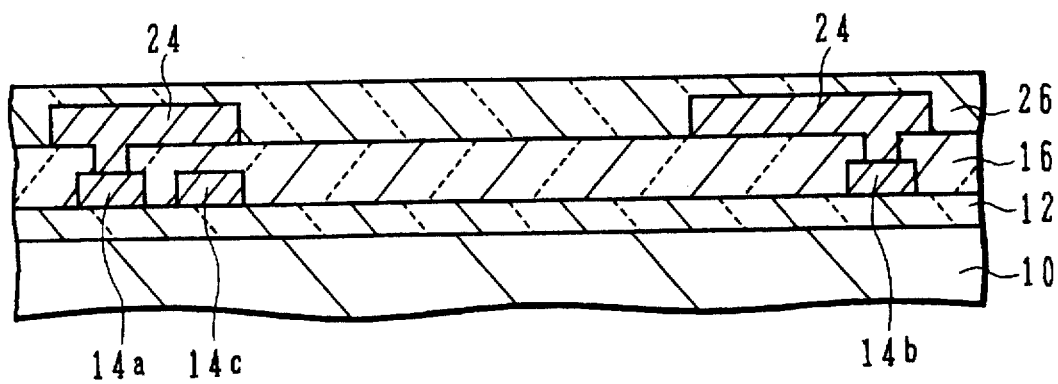
Figure 10:
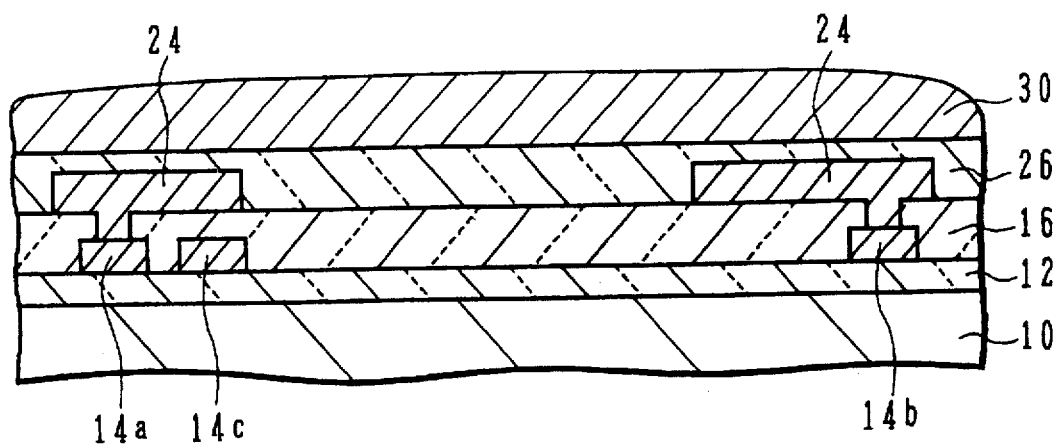
Figure 11:
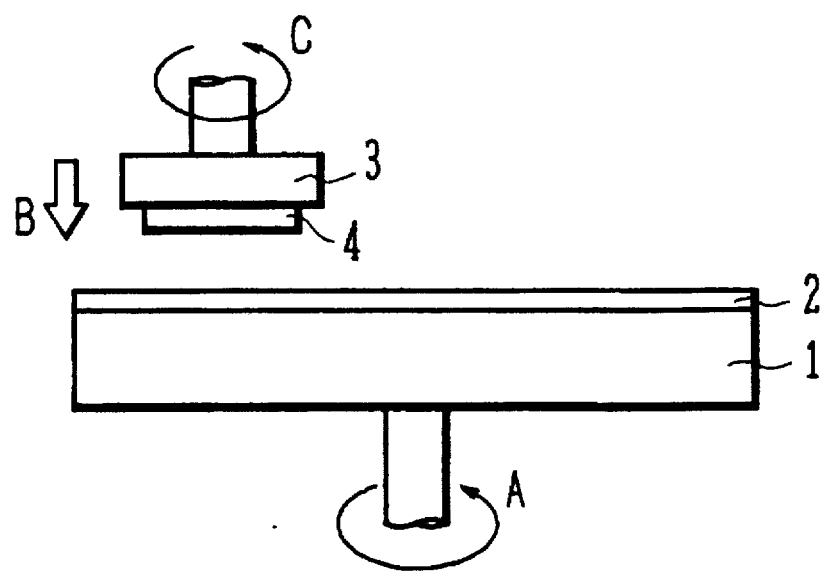
FIG. 11 is a side view showing the outline of a CMP apparatus.
Figure 12:
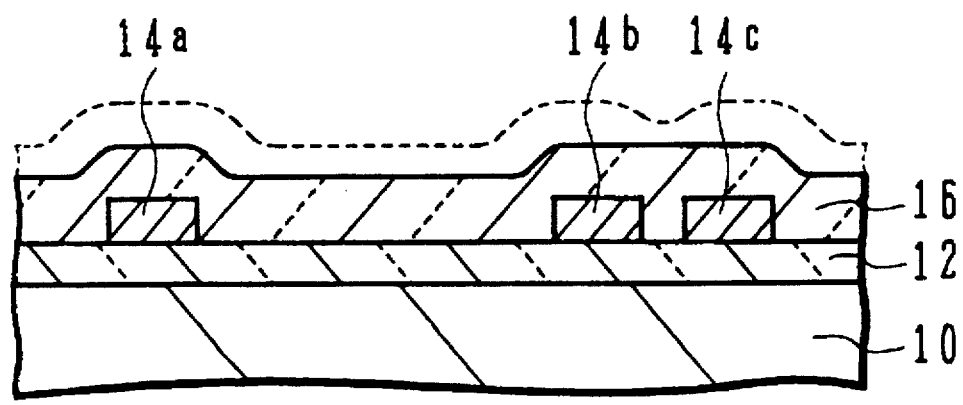
FIG. 12 is a cross-sectional view showing an example of the structure of a substrate of a CMP process, the substrate having regions where wiring patterns are dense and sparse.

Next, as shown in FIG. 5, using etching gas such as $CF_4$, $CF_4+H_2$, and $CF_4+CHF_3+Ar$, contact holes 22 reaching the wiring layers 14a and 14b are formed in the insulating film 16. As shown in FIG. 6, a metal wiring 24 such as a single layer of aluminum or aluminum alloy (e.g.,: Al—Si alloy, AlSiCu alloy), and a laminated layer of aluminum or aluminum alloy, and titanium is formed to be connected to the wiring layers 14a and 14b via the contact holes 22, and selectively etched to have desired patterns. Next, as shown in FIG. 7, a second insulating film 26 is formed in the manner described with the above-embodiment. The second insulating film 26 has conformal topography to the underlying metal wiring patterns and the second insulating film 26 has concave and convex regions, the width of the concave region being wider than that of the convex region. That is to say, the second insulating film 26 has a non-planar surface. If an upper metal wiring layer is formed on the second Insulating layer 26 having such a very poor flatness, the wiring pattern precision is lowered by irregular reflection of exposure light. To overcome such a problem, a sacrificial layer 28 of SOG is formed on the second insulating film 26 as shown in FIG. 8. The sacrificial layer 28 has a laminated structure of an organic glass layer 28-1 and an inorganic glass layer 28-2 formed by separately coating organic SOG and inorganic SOG. The organic SOG is prepared by mixing $R_nSi(OH)_{4-n}$ organic glass with solvent, where R stands for —$CH_3$, —$C_6H_5$, or —$C_2H_5$. The inorganic SOG is prepared by mixing $Si(OH)_4$ with solvent. Inorganic SOG has a hardness nearer to a hardness of a CVD oxide film such as BPSG than organic SOG. Therefore, a polishing speed generally the same as a CVD oxide film can be obtained during a CMP process. The CMP process is performed under the conditions used by the above-described embodiment to polish both the second insulating film 26 and sacrificial layer 28 until the layer 28 is thoroughly removed, to thus form a planarized second insulating film as shown in FIG. 9. Lastly, a passivation film 30 such as silicon nitride is formed as shown in FIG. 10.

In the illustrative embodiment, two metal wiring layers have been formed. The present invention is applicable to a semiconductor substrate having a larger number of metal wiring layers and interlevel insulating films. The order of an organic SOG film and an inorganic SOG film of the sacrificial layer may be changed. Silicon denaturized polyimide or other materials may also be used for the sacrificial layer. The material of a wiring layer may be other metals such as aluminum, aluminum/titanium, refractory metal silicide (e.g., $WSi_x$, $TiSi_x$, and the like), polycrystalline silicon, copper, tungsten amorphous silicon, and the like.

In the illustrative embodiment, the interlayer insulating film 16 is made of PSG, BPSG and silicon oxide made through a plasma CVD technique using source gases of TEOS and oxygen. However, the interlayer insulating film 16 is not limited to such examples. For example, the present invention can be implemented in a semiconductor device having an interlayer insulating film made of a plasma silicon oxide film formed by atmospheric ozone-TEOS CVD by using a mixed source gas of ozone-containing oxygen and TEOS. The plasma silicon oxide film formed by atmospheric CVD by using a source gas of ozone-TEOS has a characteristic of being slightly reflowed while being deposited, while depression topography which corresponds to the concave portion in the illustrative embodiment still remains therein.

The present invention has been described in connection with the preferred embodiments. The invention is not limited only to the above embodiments. For example, the lower level sacrificial layer may also be formed of a laminate of two or more layers, and the upper level sacrificial layer may also be formed of a single layer or three or more layers. It is apparent to those skilled in the art that various other modifications, substitutions, combinations and the like can be made without departing from the scope of the appended claims.

I claim:

1. A method of manufacturing a semiconductor device with multi-layer wiring, the method comprising the steps of:
   (a) providing a semiconductor substrate having a first level wiring structure thereon;
   (b) forming a second level wiring structure on the first level wiring structure;
   (c) forming an interlevel insulating film on the second level wiring structure, the interlevel insulating film having a corrugated surface, the interlevel insulating film directly contacting said second level wiring structure;
   (d) forming a sacrificial film over the interlevel insulating film, said sacrificial film having non-conformal topography to the underlying interlevel insulating film to form a planar upper surface on the semiconductor device, wherein said forming the sacrificial film over the interlevel insulating film includes:
      (d-1) forming a first sacrificial sublayer over the interlevel insulating film directly contacting said second level wiring structure, the first sacrificial sublayer including silanol-based organic spin-on-glass; and
      (d-2) forming a second sacrificial sublayer over the first sacrificial sublayer to provide a laminated structure of the first and second sacrificial sublayers, the second sacrificial sublayer including inorganic spin-on-glass; and
   (e) chemical-mechanical polishing the interlevel insulating film directly contacting said second level wiring structure and the sacrificial film to provide a planarized interlevel insulating film directly contacting said second level wiring structure.

2. A method of manufacturing a semiconductor device with multi-layer wiring, the method comprising the steps of:
   (a) providing an underlying structure of a semiconductor substrate having a first level wiring structure thereon;
   (b) forming a first interlevel insulating film over the underlying structure having conformal topography to the underlying structure, said first interlevel insulating film directly contacting said underlying first level wiring structure;
   (c) forming a first sacrificial film over the first insulating film, said first sacrificial film having non-conformal topography to the first insulating film and having a substantially planar upper surface, wherein said forming the first sacrificial film over the first insulating film includes:
      (c-1) forming a first sacrificial sublayer over the first interlevel insulating film directly contacting said underlying first wiring structure, the first sacrificial sublayer including silanol-based organic spin-on-glass; and
      (c-2) forming a second sacrificial sublayer over the first sacrificial sublayer to provide a laminated structure of the first and second sublayers, the second sacrificial sublayer including inorganic spin-on-glass;
   (d) chemical-mechanical polishing the first interlevel insulating film directly contacting said underlying first level wiring structure and the first sacrificial film to provide a planarized first interlevel insulating film directly contacting said underlying first level wiring structure;
   (e) forming a second level wiring structure on the planarized first interlevel insulating film;
   (f) forming a second interlevel insulating film over the second level wiring structure having conformal topography to the second level wiring structure, said second interlevel insulating film directly contacting said underlying second level wiring structure;
   (g) forming a second sacrificial film over the second interlevel insulating film, said second sacrificial film having non-conformal topography to the second interlevel insulating film and having a substantially planar upper surface; and
   (h) chemical-mechanical polishing the second interlevel insulating film directly contacting said underlying second level wiring structure and the second sacrificial film to provide a planarized second interlevel insulating film directly contacting said underlying second level wiring structure.

3. A method of manufacturing a semiconductor device with multi-layer wiring, the method comprising the steps of:
   (a) providing an underlying structure of a semiconductor substrate having a first level wiring structure thereon;
   (b) forming a first interlevel insulating film over the underlying structure having conformal topography to the underlying structure, said first interlevel insulating film directly contacting said underlying first level wiring structure;
   (c) forming a first sacrificial film over the first insulating film, said first sacrificial film having non-conformal topography to the first insulating film and having a substantially planar upper surface;

(d) chemical-mechanical polishing the first interlevel insulating film directly contacting said underlying first level wiring structure and the first sacrificial film to provide a planarized first interlevel insulating film directly contacting said underlying first level wiring structure:

(e) forming a second level wiring structure on the planarized first interlevel insulating film;

(f) forming a second interlevel insulating film over the second level wiring structure having conformal topography to the second level wiring structure, said second interlevel insulating film directly contacting said underlying second level wiring structure;

(g) forming a second sacrificial film Over the second interlevel insulating film, said second sacrificial film having non-conformal topography to the second interlevel insulating film and having a substantially planar upper surface, wherein said forming the second sacrificial film over the second interlevel insulating film includes:

(g-1) forming a first sacrificial sublayer over the second interlevel insulating film directly contacting said underlying second level wiring structure, the first sacrificial sublayer including silanol-based organic spin-on-glass; and (g-2) forming a second sacrificial sublayer over the first sacrificial sublayer to provide a laminated structure of the first and second sublayers, the second sacrificial sublayer including inorganic spin-on-glass; and (h) chemical-mechanical polishing the second interlevel insulating film directly contacting said underlying second level wiring structure and the second sacrificial film to provide a planarized second interlevel insulating film directly contacting said underlying second level wiring structure.

4. A method of manufacturing a semiconductor device with multi-layer wiring, the method comprising the steps of:

(a) providing a semiconductor substrate having a first level wiring structure thereon;

(b) forming a second level wiring structure on the first level wiring structure;

(c) forming an interlevel insulating film on the second level wiring structure, the interlevel insulating film having a corrugated surface, the interlevel insulating film directly contacting said second level wiring structure;

(d) forming a sacrificial film over the interlevel insulating film, said sacrificial film having non-conformal topography to the underlying interlevel insulating film to form a planar upper surface on the semiconductor device, wherein said forming the sacrificial film over the interlevel insulating film includes:

(d-1) forming a first sacrificial sublayer over the interlevel insulating film directly contacting said second level wiring structure, the first sacrificial sublayer including inorganic spin-on-glass; and (d-2) forming a second sacrificial sublayer over the first sacrificial sublayer to provide a laminated structure of the first and second sacrificial sublayers, the second sacrificial sublayer including silanol-based organic spin-on-glass; and (e) chemical-mechanical polishing the interlevel insulating film directly contacting said second level wiring structure and the sacrificial film to provide a planarized interlevel insulating film directly contacting said second level wiring structure.

5. A method of manufacturing a semiconductor device with multi-layer wiring, the method comprising the steps of:

(a) providing a semiconductor substrate having a first level wiring structure thereon;

(b) forming a second level wiring structure having a first thickness on the first level wiring structure;

(c) forming an interlevel insulating film directly on the second level wiring structure, the interlevel insulating film having a second thickness thicker than said first thickness and having a corrugated surface having a convex portion having a first width and a concave portion having a second width wider than the first width;

(d) forming a sacrificial film over the interlevel insulating film having non-conformal topography to the underlying interlevel insulating film, the concave portion being filled with the sacrificial film, wherein said forming the sacrificial film over the interlevel insulating film includes:

(d-1) forming a first sacrificial sublayer over the interlevel insulating film, the first sacrificial sublayer including silanol-based organic spin-on-glass; and (d-2) forming a second sacrificial sublayer over the first sacrificial sublayer to provide a laminated structure of the first and second sacrificial sublayers, the second sacrificial sublayer including inorganic spin-on-glass; and (e) chemical-mechanical polishing the interlevel insulating film having said second thickness thicker than said first thickness and the sacrificial film to provide a planarized interlevel insulating film.

6. A method of manufacturing a semiconductor device with multi-layer wiring, the method comprising the steps of:

(a) providing an underlying structure of a semiconductor substrate having a first level wiring structure having a first thickness thereon;

(b) forming a first interlevel insulating film directly over the underlying structure having conformal topography to the underlying structure, the first interlevel insulating film having a second thickness thicker than said first thickness and having a first convex portion having a first width and a first concave portion having a second width wider than the first width;

(c) forming a first sacrificial film over the first interlevel insulating film having non-conformal topography to the first interlevel insulating film, the first concave portion being filled with the first sacrificial film, wherein said forming the first sacrificial film over the first interlevel insulating film includes:

(c-1) forming a first sacrificial sublayer over the first interlevel insulating film, the first sacrificial layer including silanol-based organic spin-on-glass; and (c-2) forming a second sacrificial sublayer over the first sacrificial sublayer to provide a laminated structure of the first and second sublayers, the second sacrificial layer including inorganic spin-on-glass;

(d) chemical-mechanical polishing the first interlevel insulating film having a second thickness thicker than said first thickness and the first sacrificial film to provide a planarized first interlevel insulating film;

(e) forming a second level wiring structure having a third thickness on the planarized first insulating film;

(f) forming a second intelevel insulating film directly over the second level wiring structure having conformal topography to the second level wiring structure, the second interlevel insulating film having a fourth thickness thicker than said third thickness and having a second convex portion having a third width and a second concave portion having a fourth width wider than the third width;

(g) forming a second sacrificial film, having non-conformal topography to the second interlevel insulating film, the second concave portion being filled with the second sacrificial film; and (h) chemical-mechanical polishing the second interlevel insulating film having said fourth thickness thicker than said third thickness and the second sacrificial film to provide a planarized second interlevel insulating film.

7. A method of manufacturing a semiconductor device with multi-layer wiring, the method comprising the steps of:

(a) providing an underlying structure of a semiconductor substrate having a first level wiring structure having a first thickness thereon;

(b) forming a first interlevel insulating film directly over the underlying structure having conformal topography to the underlying structure, the first interlevel insulating film having a second thickness thicker than said first thickness and having a first convex portion having a first width and a first concave portion having a second width wider than the first width;

(c) forming a first sacrificial film over the first interlevel insulating film having non-conformal topography to the first interlevel insulating film, the first concave portion being filled with the first sacrificial film;

(d) chemical-mechanical polishing the first interlevel insulating film having a second thickness thicker than said first thickness and the first sacrificial film to provide a planarized first interlevel insulating film;

(e) forming a second level wiring structure having a third thickness on the planarized first insulating film;

(f) forming a second interlevel insulating film directly over the second level wiring structure having conformal topography to the second level wiring structure, the second interlevel insulating film having a fourth thickness thicker than said third thickness and having a second convex portion having a third width and a second concave portion having a fourth width wider than the third width;

(g) forming a second sacrificial film, having non-conformal topography to the second interlevel insulating film, the second concave portion being filled with the second sacrificial film, wherein said forming the second sacrificial film includes:

(g-1) forming a first sacrificial sublayer over the second interlevel insulating film, the first sacrificial sublayer including silanol-based organic spin-on-glass; and (g-2) forming a second sacrificial sublayer over the first sacrificial sublayer to provide a laminated structure of the first and second sublayers, the second sacrificial sublayer including inorganic spin-on-glass; and (h) chemical-mechanical polishing the second interlevel insulating film having said fourth thickness thicker than said third thickness and the second sacrificial film to provide a planarized second interlevel insulating film.

8. A method of manufacturing a semiconductor device with multi-layer wiring, the method comprising the steps of:

(a) providing an underlying structure of a semiconductor substrate having an interconnection of wiring layers thereon;

(b) forming a first insulating film over the underlying structure having conformal topography to the underlying structure;

(c) forming a laminated sacrificial film having an upper surface and non-conformal topography to the first insulating film so that the upper surface of the laminated sacrificial film is planar, said laminated sacrificial film including a first sacrificial film of a first material formed over the interlevel insulating film and a second sacrificial film of a second material different from said first material formed over the first sacrificial film;

(d) chemical-mechanical polishing the first insulating film and the laminated sacrificial film to provide a planarized first insulating film; and (e) depositing a layer of wiring material on the planarized first insulating film and then forming an upper wiring layer from the deposited layer of wiring material by use of photolithography.

9. The method of claim 8, wherein the first sacrificial film includes silanol-based organic spin-on-glass and the second sacrificial film includes inorganic spin-on-glass.

10. The method of claim 8, wherein the second sacrificial film includes silanol-based organic spin-on-glass and the first sacrificial film includes inorganic spin-on-glass.

11. The method of claim 8, wherein at the step (b), the first insulating film has convex topography and concave topography, and a width of said concave topography is larger than a width of said convex topography.

12. The method of claim 11, wherein at the step (b), the first insulating film includes a material selected from the group consisting of BPSG, PSG, and $SiO_2$ made through a plasma CVD technique.

13. The method of claim 8, wherein at the step (d), the laminated sacrificial film is thoroughly removed.

14. A method of manufacturing a semiconductor device with multi-layer wiring, the method comprising the steps of:

(a) providing a semiconductor substrate having a first level wiring structure thereon;

(b) forming a second level wiring structure on the first level wiring structure;

(c) forming an interlevel insulating film on the second level wiring structure, the interlevel insulating film having a corrugated surface;

(d) forming a first sacrificial film of a first material over the interlevel insulating film;

(e) forming a second sacrificial film of a second material different from said first material over the first sacrificial film to provide a laminated structure of the first and second sacrificial films having non-conformal topography to the underlying interlevel insulating film to form a planar upper surface on the semiconductor device; and (f) chemical-mechanical polishing the interlevel insulating film and the laminated structure of the first and second sacrificial films to provide a planarized interlevel insulating film.

15. The method of claim 14, wherein the first sacrificial film includes silanol-based organic spin-on-glass and the second sacrificial film includes inorganic spin-on-glass.

16. The method of claim 14, wherein the second sacrificial film includes silanol-based organic spin-on-glass and the first sacrificial film includes inorganic spin-on-glass.

17. The method of claim 14, wherein the first level wiring structure and the second level wiring structure include a material selected from the group consisting of aluminum, aluminum-silicon alloy, and aluminum-silicon-copper alloy.

18. The method of claim 14, wherein the first level wiring structure and the second level wiring structure have a laminated structure of one of aluminum and aluminum alloy, and titanium.

19. The method of claim 14, wherein at the step (c), the interlevel insulating film has convex topography and concave topography, and a width of said concave topography is larger than a width of said convex topography.

20. The method of claim 19, wherein at the step (c), the interlevel insulating film includes a material selected from the group consisting of BPSG, PSG, and $SiO_2$ made through a plasma CVD technique.

21. The method of claim 14, wherein at the step (f), the laminated structure of the first and second sacrificial films is thoroughly removed.

22. A method of manufacturing a semiconductor device with multi-layer wiring, the method comprising the steps of:
 (a) providing an underlying structure of a semiconductor substrate having a first level wiring structure thereon;
 (b) forming a first interlevel insulating film over the underlying structure having conformal topography to the underlying structure;
 (c) forming a first sacrificial sublayer of a first material for a first sacrificial film over the first interlevel insulating film;
 (d) forming a second sacrificial sublayer of a second material different from said first material for said first sacrificial film over the first sacrificial sublayer to provide a laminated structure of said first sacrificial film having non-conformal topography to the first insulating film and having a substantially planar upper surface;
 (e) chemical-mechanical polishing the first interlevel insulating film and the laminated structure of the first sacrificial film to provide a planarized first interlevel insulating film;
 (f) forming a second level wiring structure on the planarized first interlevel insulating film;
 (g) forming a second interlevel insulating film over the second level wiring structure having conformal topography to the second level wiring structure;
 (h) forming a third sacrificial sublayer of a third material for a second sacrificial film over the second interlevel insulating film;
 (i) forming a fourth sacrificial sublayer of a fourth material different from said third material for said second sacrificial film over the third sacrificial sublayer to provide a laminated structure of said second sacrificial film having non-conformal topography to the second interlevel insulating film and having a substantially planar upper surface; and
 (j) chemical-mechanical polishing the second interlevel insulating film and the laminated structure of the second sacrificial film to provide a planarized second interlevel insulating film.

23. The method of claim 22, wherein the first sacrificial sublayer includes silanol-based organic spin-on-glass and the second sacrificial sublayer includes inorganic spin-on-glass.

24. The method of claim 22, wherein the second sacrificial sublayer includes silanol-based organic spin-on-glass and the first sacrificial sublayer includes inorganic spin-on-glass.

25. The method of claim 22, wherein at the step (e), the laminated structure of the first sacrificial film is thoroughly removed.

26. The method of claim 22, wherein the third sacrificial sublayer includes silanol-based organic spin-on-glass and the fourth sacrificial sublayer includes inorganic spin-on-glass.

27. The method of claim 22, wherein the fourth sacrificial sublayer includes silanol-based organic spin-on-glass and the third sacrificial sublayer includes inorganic spin-on-glass.

28. The method of claim 22, wherein at the step (j), the laminated structure of the second sacrificial film is thoroughly removed.

29. A surface planarizing method comprising the steps of:
 (a) forming an insulating film on the surface of a substrate having a step;
 (b) coating the insulating film with a laminated flat film having an upper surface and non-conformal topography to the insulating film so that the upper surface of the laminated flat film is planar, said laminated flat film including a first film of a first material formed over the insulating film and a second film of a second material different from said first material formed over the first film; and
 (c) chemical-mechanical polishing the insulating film and the laminated flat film at a substantially similar material removal polishing speed for both the insulating film and the laminated flat film until the laminated flat film is thoroughly removed, to leave a planarized insulating film.

30. The method of claim 29, wherein the first film includes silanol-based organic spin-on-glass and the second film includes inorganic spin-on-glass.

31. The method of claim 29, wherein the second film includes silanol-based organic spin-on-glass and the first film includes inorganic spin-on-glass.

* * * * *